United States Patent
Hosono et al.

(10) Patent No.: US 7,892,458 B2
(45) Date of Patent: Feb. 22, 2011

(54) METALLIC ELECTROCONDUCTIVE 12CAO 7AL$_2$O$_3$ COMPOUND AND PROCESS FOR PRODUCING THE SAME

(75) Inventors: Hideo Hosono, Kanagawa (JP); Sungwng Kim, Kanagawa (JP); Katsurou Hayashi, Tokyo (JP); Masashi Miyakawa, Kanagawa (JP); Satoru Matsuishi, Tokyo (JP); Toshio Kamiya, Kanagawa (JP); Masahiro Hirano, Tokyo (JP); Yoshitake Toda, Saitama (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 122 days.

(21) Appl. No.: 12/094,936

(22) PCT Filed: Nov. 17, 2006

(86) PCT No.: PCT/JP2006/322991
§ 371 (c)(1),
(2), (4) Date: Mar. 2, 2009

(87) PCT Pub. No.: WO2007/060890
PCT Pub. Date: May 31, 2007

(65) Prior Publication Data
US 2009/0224214 A1        Sep. 10, 2009

(30) Foreign Application Priority Data
Nov. 24, 2005     (JP) ................... 2005-339538

(51) Int. Cl.
*H01B 1/08*           (2006.01)
(52) U.S. Cl. ................... 252/520.2; 252/518.1; 423/600
(58) Field of Classification Search .............. 252/518.1, 252/520.2; 423/600
See application file for complete search history.

(56) References Cited

U.S. PATENT DOCUMENTS

| 5,675,972 | A | 10/1997 | Edelson |
| 6,818,192 | B2 * | 11/2004 | Hosono et al. .............. 423/115 |
| 7,235,225 | B2 * | 6/2007 | Hosono et al. .............. 423/600 |

(Continued)

FOREIGN PATENT DOCUMENTS

JP     2002-003218 A    1/2002

(Continued)

OTHER PUBLICATIONS

Von Hans Bartl et al.; "Zur Struktur des 12CaO 7Al2O3" Jarhrb. Mineral, Monatsh. pp. 547-552, 1970.

(Continued)

*Primary Examiner*—Mark Kopec
(74) *Attorney, Agent, or Firm*—Westerman, Hattori, Daniels & Adrian, LLP

(57) ABSTRACT

In an electride C12A7 provided by replacing free oxygen in 12CaO.7Al$_2$O$_3$ with electrons, a material having metallic electroconductivity and an electric conductivity of more than 5×10$^2$ S/cm at room temperature could not have been produced without difficulties. An electride 12CaO.7Al$_2$O$_3$, which has metallic electroconductivity and has an electric conductivity of more than 5×10$^2$ S/cm at room temperature, can be produced by heat-treating titanium metal vapor and 12CaO.7Al$_2$O$_3$ single crystal, sinter, or thin film at a temperature above 600° C. and below 1,450° C. for less than 240 hours. Further, thermoelectric field electron release can also be realized using an electron release chip fabricated from the electride.

2 Claims, 2 Drawing Sheets

U.S. PATENT DOCUMENTS

| | | | |
|---|---|---|---|
| 7,507,289 B2 * | 3/2009 | Hosono et al. | 117/4 |
| 7,662,357 B2 * | 2/2010 | Hosono et al. | 423/447.1 |
| 7,722,846 B2 * | 5/2010 | Hosono et al. | 423/263 |
| 7,767,116 B2 * | 8/2010 | Namba et al. | 252/518.1 |
| 2002/0172726 A1 | 11/2002 | Hosono et al. | |

FOREIGN PATENT DOCUMENTS

| | | |
|---|---|---|
| JP | 2002-316867 A | 10/2002 |
| JP | 2003-040697 A | 2/2003 |
| JP | 2003-128415 A | 5/2003 |
| JP | 2004-026608 A | 1/2004 |
| JP | 2005-067915 A | 3/2005 |
| JP | 2005-314196 A | 11/2005 |
| WO | 03-089373 A1 | 10/2003 |
| WO | 2005-000741 A1 | 1/2005 |

OTHER PUBLICATIONS

Hideo Hosono et al.; "Occurrence of Superoxide Radical Ion in Crystalline 12CaO 7Al2O3 Prepared via Solid-State Reactions"; American Chemical Society, vol. 26, No. 8, pp. 1192-1195, 1987.

Hideo Hoswono et al."Zairyo Kagaku", Materials Science, vol. 33, No. 4, pp. 171-172, 1996.

Katsuro Hayashi et al.; Light-induced conversion of an insulating refractory oxide into a persistent electronic conductor: Nature, vol. 419, No. 6906, pp. 462-465, Oct. 3, 2002.

M. Lacerda et al.; Electrical properties of Ca12A114O33: Effect of hydrogen reduction: Solid State Ionics, vol. 59, pp. 257-262, 1993.

Frederick U. Tehan et al.; "Alkali Anions. Preparation and Crystal Structure of a Compound Which Contains the Cryptated Sodium Cation and the Sodium Anion"; Journal of the American Chemical Society, vol. 96, pp. 7203-7208, 1974.

Andrew S. Ichimura et al.; "Toward Inorganic Electride", J. Am. Chem. Soc., vol. 124, No. 7, p. 1170. 2002.

Satoru Matsuishi et al.; High-Density Electron Anions in a Nanoporous Single Crystal: [Ca24A128O64]4+(4e−); Science, vol. 301, pp. 624-629, 2003.

International Search Report of PCT/JP2006/322991, date of mailing Dec. 26, 2006.

* cited by examiner

[Fig.1]
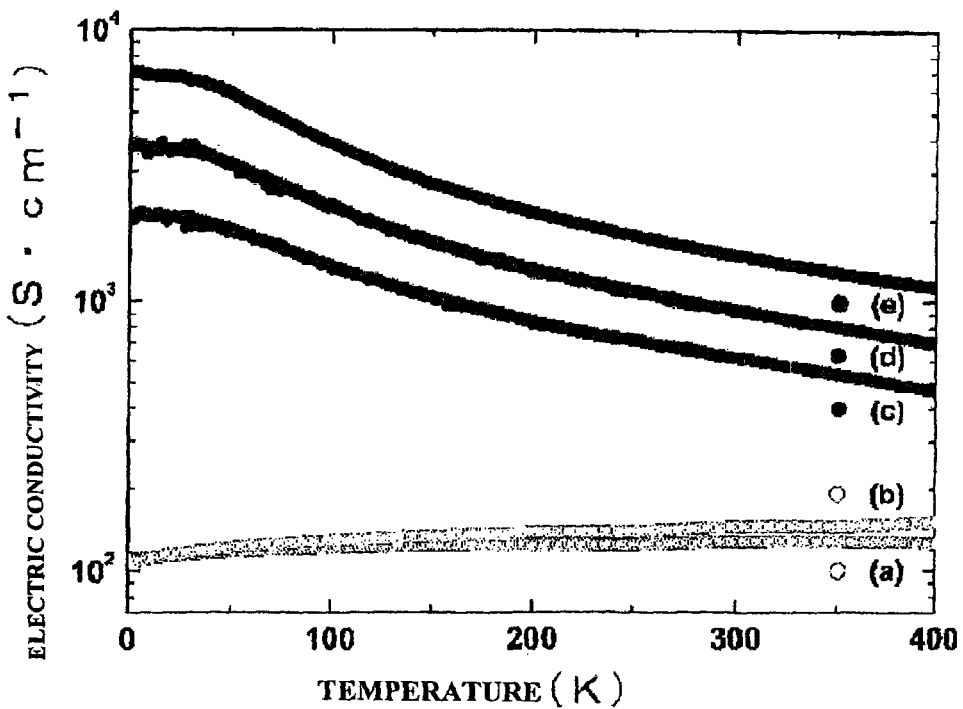
[Fig.2]
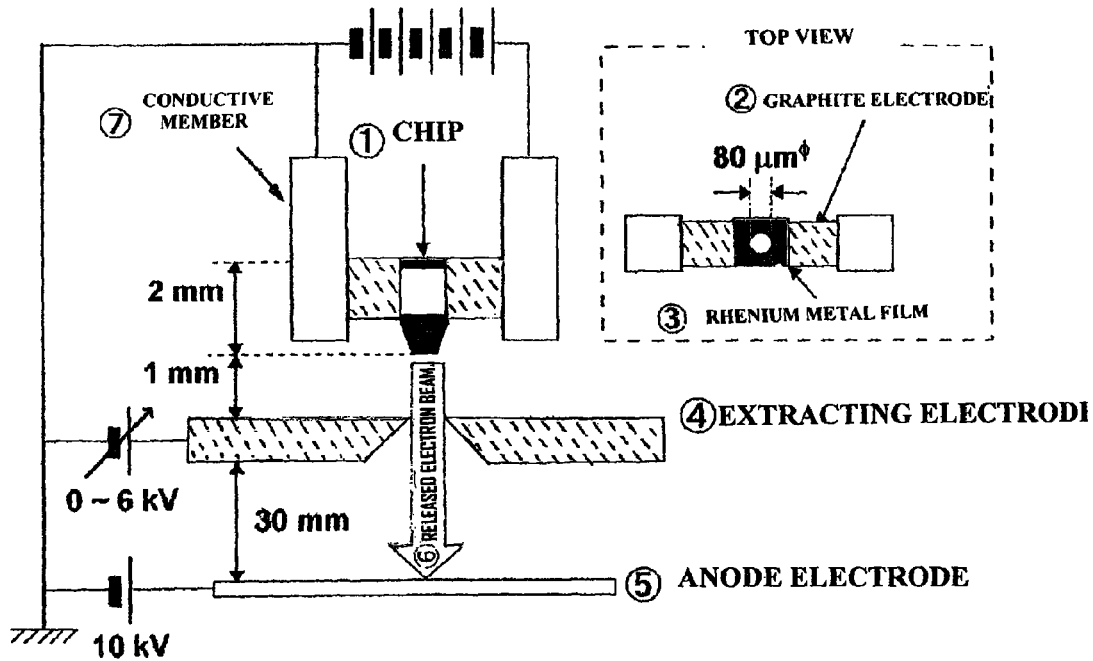

[Fig.3]
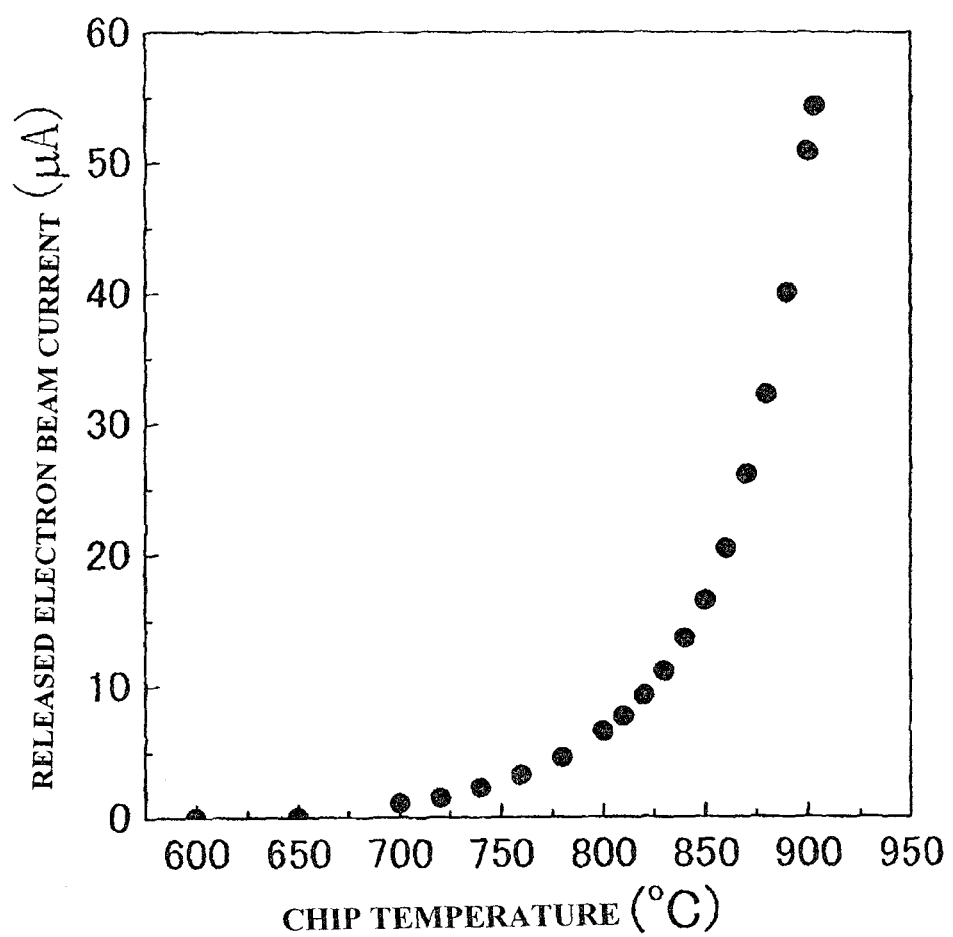

METALLIC ELECTROCONDUCTIVE 12CAO 7AL$_2$O$_3$ COMPOUND AND PROCESS FOR PRODUCING THE SAME

TECHNICAL FIELD

The present invention relates to a compound formed by introducing electrons into a 12CaO.7Al$_2$O$_3$ compound (hereinafter referred to as "C12A7") in a high concentration to achieve metallic electroconductivity, that is, to increase electric conductivity with decreasing temperature, a process for producing the compound, and a use of the compound.

BACKGROUND ART

In 1970, H. B. Bartl et al. reported a peculiar feature that among sixty-six oxygen atoms within a unit cell containing two molecules in C12A7 crystals, two oxygen atoms are clathrated as "free oxygen" in a space of each cage (cage structure) existing in the crystals (Non-Patent Document 1). Afterwards, it was found that the free oxygen can be replaced with various types of anions.

Hosono, who is one of the inventors of the present invention, has discovered that about $1\times10^{19}$ cm$^{-3}$ of O$_2^-$ are clathrated by measuring the electron spin resonance of C12A7 crystals synthesized by a solid-phase reaction using CaCO$_3$ and Al$_2$O$_3$ or Al(OH)$_3$ as starting materials in air at a temperature of 1,200° C. Hosono has proposed a model in which some free oxygen ions exist in each cage in the form of O$_2^-$ (Non-Patent Documents 2 and 3).

The present inventors have discovered that a C12A7 compound which clathrates active oxygen species in a high concentration of $10^{20}$ cm$^{-3}$ or more can be produced by a solid-phase reaction using a starting material prepared by mixing calcium and aluminum in an atomic equivalence ratio of about 12:14 at a controlled temperature under a controlled atmosphere. A patent application related to inventions regarding the compound itself, a process for producing the compound, means for extracting clathrate ions, a method of identifying active oxygen ion radicals, and a use of the compound has been filed (Patent Document 1). Furthermore, the present inventors have filed a patent application related to inventions regarding C12A7 compound single crystal containing a high concentration of active oxygen species and a process for producing C12A7 single crystal free of air bubbles (Patent Document 2).

Furthermore, the present inventors have found a method of clathrating or extracting active oxygen at about 700° C. by controlling the concentration of anion other than oxygen ions, such as OH$^-$ ions in the compound and have filed a patent application related to this invention (Patent Document 3). In addition, the present inventors have synthesized a C12A7 compound containing OH$^-$ ions in a concentration of $10^{21}$ cm$^{-3}$ or more by sintering in an oxygen atmosphere a C12A7 compound powder obtained by a hydration reaction in water, in a solvent containing moisture, or in a gas containing water vapor, and have filed a patent application regarding the inventions related to the compound itself, a process for producing the compound, a method of identifying OH$^-$ ions, and a use of the compound (Patent Document 4).

In addition, the present inventors have found that hydrogen anions can be extracted in vacuum by applying an electric field to a C12A7 compound containing hydrogen anions. Furthermore, the present inventors have discovered that green coloring of the compound occurs by irradiation of ultraviolet rays or X-rays, at the same time, the compound is permanently changed from an electrical insulator to an electrical conductor, and the compound can be returned to the insulating state again by heating or by irradiation of a strong visible light. The present inventors have filed a patent application regarding an invention related to the application of this finding (Patent Document 5 and Non-Patent Document 4). In addition, the present inventors have filed a patent application regarding inventions related to a method of permanently converting C12A7, which is originally an electrical insulator, to an electrical conductor by allowing an alkali metal to clathrate in C12A7, and a material that can exhibit an electrical conduction property in air at room temperature (Patent Document 6). In addition, an effect of hydrogen reduction on the electrical conduction property of C12A7 has been reported (Non-Patent Document 5).

Electride compounds are a concept which was first proposed by J. L. Dye (Non-Patent Document 6), and realized for the first time by forming, for example, a compound containing a crown ether as a cation and electrons as anions. It is known that electrides exhibit an electrical conduction property due to hopping of electrons contained as anions. Thereafter, some organic electride compounds were found, but all of these compounds are stable only at low temperatures of about 200K or lower and significantly unstable compounds which react with air or water.

Recently, an inorganic electride compound prepared by doping cesium into a zeolite compound powder having a silica skeleton was found. This silica zeolite plays a role of complexation as in a crown ether to achieve stabilization at room temperature. However, this compound is also highly reactive with moisture and chemically unstable (Non-Patent Document 7). Furthermore, a diode utilizing an excellent electron-releasing property of an electride compound has been proposed (Non-Patent Document 8). However, since electride compounds which have been obtained to date are thermally and chemically unstable, the proposed vacuum diode can be operated only at low temperatures.

The present inventors have found that a C12A7 compound having an electric conductivity of less than $10^3$ S/cm can be obtained by heat-treating C12A7 single crystal in an alkali metal vapor and an alkaline-earth metal vapor at a high temperature, performing ion implantation of an inert ion into C12A7 single crystal, or solidifying a C12A7 compound directly from a melt thereof in a reducing atmosphere containing carbon, and have filed a patent application regarding a related invention (Patent Document 9). Almost all free oxygen ions in these C12A7 compounds having a high electric conductivity are replaced with electrons. Such C12A7 compounds are substantially represented by [Ca$_{24}$Al$_{28}$O$_{64}$]$^{4+}$ (4e$^-$), and can be considered to be inorganic electride compounds (Non-Patent Document 8). The present inventors have further filed a patent application regarding an invention related to a proton-electron mixed conductor obtained by heat-treating C12A7 or a compound similar thereto in a hydrogen atmosphere (Patent Document 9) and an invention related to an electroconductive complex oxide crystalline compound (Patent Document 10).

Patent Document 1: Japanese Patent Application No. 2001-49524 (Japanese Unexamined Patent Application Publication No. 2002-3218)

Patent Document 2: Japanese Patent Application No. 2001-226843 (Japanese Unexamined Patent Application Publication No. 2003-40697)

Patent Document 3: Japanese Patent Application No. 2001-321251 (Japanese Unexamined Patent Application Publication No. 2003-128415)

Patent Document 4: Japanese Patent Application No. 2001-117546 (Japanese Unexamined Patent Application Publication No. 2002-316867)

Patent Document 5: Japanese Patent Application No. 2003-586095 (Domestic re-publication of PCT International Publication for patent application Ser. No. 03/089,373)

Patent Document 6: Japanese Patent Application No. 2002-188561 (Japanese Unexamined Patent Application Publication No. 2004-26608)

Patent Document 7: U.S. Pat. No. 5,675,972, specification and drawings

Patent Document 8: PCT/JP2004/001507 (WO2005/000741 A1)

Patent Document 9: Japanese Patent Application No. 2003-209138 (Japanese Unexamined Patent Application Publication No. 2005-67915)

Patent Document 10: Japanese Patent Application No. 2004-136942 (Japanese Unexamined Patent Application Publication No. 2005-314196)

Non-Patent Document 1: H. B. Bartl and T. Scheller, Neuses Jarhrb. Mineral, Monatsh. 1970, 547

Non-Patent Document 2: H. Hosono and Y. Abe, Inorg. Chem. 26, 1193, 1987

Non-Patent Document 3: Hideo Hosono et al., "Zairyo Kagaku" (Materials science) Vol. 33, No. 4, p. 171-172, 1996

Non-Patent Document 4: K. Hayashi, Satoru Matsuishi, Toshio Kamiya, Masahiro Hirano, Hideo Hosono, Nature Vol. 419, No. 6906, pp. 462-465, 3 Oct. 2002

Non-Patent Document 5: A. R. West, et al., Solid State Ionics, Vol. 59, pages 257-262 (1993)

Non-Patent Document 6: J. Tehan, B. L. Barrett, J. L. Dye, J. Am. Chem. Soc., 96, 7203-7208 (1974)

Non-Patent Document 7: Ichimura, J. L. Dye, M. A. Camblor, L. A. Villaescusa, J. Am. Chem. Soc., 124, 1170, (2002)

Non-Patent Document 8: S. Matsuishi, Y. Toda, M. Miyakawa, K. Hayashi, T. Kamiya, M Hirano, I. Tanaka, and H. Hosono, Science 301 626-629 (2003)

DISCLOSURE OF INVENTION

Problems to be Solved by the Invention

To date, in solid-solutions of CaO and $Al_2O_3$, it has been difficult to produce a material having a high electric conductivity ($>10^4$ $Scm^{-1}$) at room temperature. Furthermore, in the above-mentioned C12A7 clathrating hydrogen anions, in order to realize a permanent electrical conduction property, a treatment using ultraviolet irradiation is necessary, and, for example, a problem of a decrease in the electric conductivity occurs at high temperatures.

In addition, the C12A7 electrides obtained by replacing free oxygen of C12A7 with electrons by heat-treating C12A7 single crystal in an alkali metal vapor and an alkaline-earth metal vapor at a high temperature, performing ion implantation of an inactive ion into C12A7 single crystal and a thin film made of C12A7, or solidifying a C12A7 compound directly from a melt thereof in a reducing atmosphere containing carbon have an electric conductivity of less than $10^3$ S/cm at room temperature. These C12A7 electrides have semiconducting electroconductivity in which the electric conductivity decreases with a decrease in the temperature or degenerate semiconducting electroconductivity in which the electric conductivity maintains a constant value. Thus, a C12A7 electride having metallic electroconductivity has not been produced.

In the case where a C12A7 electride is used as an electron release material, a compound having an electric conductivity of more than $5 \times 10^2$ S/cm at room temperature and metallic electroconductivity has been desired. An object of the present invention is to find a C12A7 electride having metallic electroconductivity and a process for producing the same.

Means for Solving the Problems

The present inventors have conducted intensive studies on a process of extracting free oxygen in a C12A7 compound by increasing the number of types of metal vapor used in the heat treatment of C12A7 single crystal at a high temperature from alkali metals and alkaline-earth metals to a wider range of material. As a result, it was found that titanium metal has an effect of extracting free oxygen superior to that of alkali metals and alkaline-earth metals.

From the standpoint of thermodynamic free energy, titanium metal has a capability of extracting free oxygen inferior to that of alkali metals and alkaline-earth metals. However, titanium metal has a high melting point (about 1,670° C.), and thus, the heat-treatment temperature of C12A7 can be increased when titanium metal vapor is used. Furthermore, oxygen ions can diffuse in a $TiO_x$ compound film formed by being deposited on the surface of C12A7 as a result of free oxygen extraction. Accordingly, titanium metal adhered to the outer surface of the film also maintains the function of extracting free oxygen, and thus an extraction reaction of free oxygen is continued until free oxygen in C12A7 is exhausted.

On the other hand, for example, in the case where vapor of calcium (Ca), which is an alkaline-earth metal, is used, since Ca metal has a low melting point (about 870° C.), the heat-treatment temperature of C12A7 cannot be increased when Ca metal vapor is used. In addition, the use of Ca metal vapor is disadvantageous in that, for example, when CaO produced by being deposited on the surface of C12A7 as a result of free oxygen extraction completely covers the surface of the C12A7, an extraction reaction of free oxygen is no longer continued.

For the above reasons, when titanium metal vapor is used, free oxygen in C12A7 can be almost completely replaced with electrons within a short time, and a high electron concentration can be achieved, as compared with the case where an alkali metal vapor and an alkaline-earth metal vapor are used. In addition, when the electron concentration becomes maximum, interaction between electrons and crystal lattices is decreased and electrons move more easily. As a result, metallic electroconductivity is exhibited.

More specifically, the present invention includes the following:

(1) An electride $12CaO \cdot 7Al_2O_3$ compound wherein free oxygen ions contained in cages present in crystals of a $12CaO \cdot 7Al_2O_3$ compound are replaced with two electrons (each represented by $e^-$) per oxygen ion; and the electride $12CaO \cdot 7Al_2O_3$ compound is substantially represented by $[Ca_{24}Al_{28}O_{64}]^{4+}(4e^-)$, has an electric conductivity of more than $5 \times 10^2$ S/cm and less than $10^5$ S/cm at room temperature, and has metallic electroconductivity in which the electric conductivity increases with a decrease in the temperature.

(2) A process for producing the compound according to item (1), wherein the free oxygen ions are replaced with electrons by heat-treating $12CaO \cdot 7Al_2O_3$ single crystal, a $12CaO \cdot 7Al_2O_3$ compound powder, or a thin film made of a $12CaO \cdot 7Al_2O_3$ compound and provided on a substrate in a temperature range of 600° C. to 1,450° C. for 1 hour or more and less than 240 hours in titanium (Ti) metal vapor.

(3) The process according to item (2), wherein a titanium (Ti) metal strip or a titanium metal powder, and the $12CaO \cdot 7Al_2O_3$ single crystal, the $12CaO \cdot 7Al_2O_3$ compound powder, or the thin film made of the $12CaO \cdot 7Al_2O_3$ compound and provided on a substrate are vacuum-sealed in a container, and maintained under heating to generate titanium (Ti) metal vapor, and the heat treatment is performed in the titanium metal vapor.

(4) An electron release element wherein the compound according to item (1) is used as an electron release material.

BEST MODE FOR CARRYING OUT THE INVENTION

A starting material used in the present invention may be C12A7 single crystal, a C12A7 powder prepared by sintering, or a C12A7 thin film deposited on a substrate. Magnesium oxide (MgO) or yttria-stabilized zirconia (YSZ) is suitable for the substrate for the C12A7 thin film. However, the substrate may be made of a material that can withstand the temperature of a heat treatment using titanium metal vapor. The C12A7 thin film may be a single-crystal thin film or a polycrystalline thin film.

C12A7 used as the starting material is synthesized by a solid-phase reaction at a sintering temperature of 1,200° C. or higher and lower than 1,415° C. using a material containing calcium and aluminum at an atomic equivalence ratio of 12:14. Typical examples of the material are calcium carbonate and aluminum oxide.

The single crystal can be obtained by a floating zone method (FZ method) or a Czochralski method (Cz method) using C12A7 prepared by the solid-phase reaction as a precursor. In the growth of C12A7 single crystal by the FZ method, a bar-shaped ceramic precursor is pulled upward while infrared rays are condensed onto the precursor bar, thereby moving a molten zone. Thus, the single crystal is continuously grown at the interface between the molten zone and a solidified portion. The present inventors have filed a patent application regarding inventions related to C12A7 compound single crystal containing a high concentration of active oxygen species and a process for producing C12A7 single crystal free of air bubbles (Patent Document 2; Japanese Unexamined Patent Application Publication No. 2003-40697). In the Cz method, a seed crystal is dipped into a melt of C12A7 in an iridium crucible, and a C12A7 single crystal is pulled upward while the seed crystal is rotated. An argon atmosphere containing about 2 volume percent of oxygen is suitable for the atmosphere used during the growth of the crystals.

The C12A7 thin film is deposited on a substrate made of, for example, MgO by a pulsed laser deposition (PLD) method using a C12A7 sintered compact as a target. The deposition method is not limited to the PLD method. Alternatively, a gas-phase method such as a sputtering method or a plasma spraying method can be employed.

The C12A7 sinter, C12A7 single crystal, or C12A7 thin film used as the starting material is maintained in an atmosphere containing titanium metal vapor at a temperature higher than 600° C. and lower than 1,450° C., and preferably higher than 1,000° C. and lower than 1,450° C. for one hour or more and less than 240 hours, and preferably more than ten hours and less than 14 hours, and then cooled to room temperature at a temperature decrease rate of about 300° C./hour.

The atmosphere containing titanium metal vapor can be produced as follows. A titanium metal strip or a titanium metal powder and C12A7 used as the starting material are vacuum-sealed in a thermally and chemically durable container made of, for example, quartz glass, and heated to a temperature higher than 600° C. and lower than 1,450° C., and preferably higher than 1,000° C. and lower than 1,450° C. to generate titanium metal vapor. It is believed that C12A7 does not react directly with the gas-phase metal vapor but reacts with metal Ti deposited on the surface of C12A7. Therefore, the vapor pressure of the titanium metal in the container need not be strictly controlled. If a titanium metal strip or a titanium metal powder is included in the container in a sufficient amount that achieves the equilibrium vapor pressure at a heat-treatment temperature selected within the range of higher than 600° C. and lower than 1,450° C., the vapor pressure in the container becomes the equilibrium vapor pressure because the heating time is longer than one hour. For example, when 5 g of titanium metal is hermetically sealed in a quartz glass tube serving as a sealed tube with an inner volume of 10 cm$^3$, the equilibrium vapor pressure can be achieved. Alternatively, titanium metal vapor may be generated in another place, and the vapor may be introduced into a place where C12A7 is heated at 600° C. or higher and lower than 1,450° C.

In any method, the atmosphere must be evacuated in order to remove oxygen in the atmosphere. In the case where a quartz glass tube is used, it is necessary to perform the heat treatment at a temperature lower than the softening point of the glass. Therefore, the heat-treatment temperature is preferably higher than 1,000° C. and lower than 1,200° C. When an alumina tube is used instead of a quartz glass tube, the heat treatment can be performed at a temperature higher than 1,200° C. and lower than 1,450° C.

The titanium metal vapor is deposited as titanium metal on the surface of C12A7 and clathrated inside C12A7. The titanium metal reacts with free oxygen contained in cages to form a titanium oxide (TiO$_x$) film on the surface of C12A7. When C12A7 is maintained at a high temperature, the speed of oxygen diffusion in C12A7 increases, and the rate of reaction between titanium metal and free oxygen at the surface of C12A7 also increases. Consequently, free oxygen extraction is performed at a high speed. In the case where a mild free oxygen extraction reaction is required in a sinter or a thin film sample, the heat-treatment temperature may be decreased to about 600° C. At a temperature lower than 600° C., the vapor pressure of titanium metal is low, and the rate of reaction of free oxygen extraction is also low. Consequently, a C12A7 compound containing a high concentration of electrons cannot be produced.

However, at a heat-treatment temperature exceeding 1,450° C., C12A7 is decomposed or molten, and thus a C12A7 electride cannot be produced. In addition, when the heat-treatment time exceeds 240 hours, oxygen is precipitated from the quartz tube or the like, thus suppressing the free oxygen extraction reaction. Consequently, the electron concentration in the C12A7 electride is saturated. In the case where the amount of oxygen precipitated from quartz glass is large, the content of electron is decreased instead.

The free oxygen extraction reaction is observed after a holding time of about one hour. With an increase in the holding time, the amount of free oxygen which has been contained in cages and is then extracted increases, resulting in the thickness of the TiO$_x$ layer on the surface of C12A7 increasing. However, even when the surface of C12A7 is completely covered with $TiO_x$, oxygen diffuses in $TiO_x$, and thus, the extraction reaction is not inhibited. Accordingly, when the heat-treatment time is sufficiently long, almost all, that is, about 95% or more of free oxygen ions can be replaced with electrons. The amount of extracted free oxygen, i.e., the electron concentration contained in the cages of C12A7 can be determined from an X-ray diffraction spectrum, the thickness of a $TiO_x$ layer, the intensity of optical absorption band having peaks at about 0.4 eV and 2.8 eV, or the electric conductivity.

The free oxygen ions contained in each cage of the prepared electride C12A7 compound are almost completely replaced with two electrons (each represented by e⁻) per oxygen ion. The electride C12A7 compound is substantially represented by $[Ca_{24}Al_{28}O_{64}]^{4+}(4e^-)$, has an electric conductivity of more than $5\times10^2$ S/cm and less than $10^5$ S/cm at room temperature, and has metallic electroconductivity in which the electric conductivity increases with a decrease in the temperature.

The prepared electride C12A7 compound is processed into a truncated pyramid sample whose tip area is about 1 mm², and heated in vacuum. An electric field is then applied to the electride C12A7 compound sample. When the sample is heated to a temperature higher than 600° C. and lower than 950° C., a high-density thermoelectric field electron beam is stably emitted for more than 100 hours at more than 1 ampere per square centimeter. The reason why electrons are efficiently released at a relatively low temperature of 900° C. and at a low electric field of about 6 kV is that the work function of electrons introduced instead of free oxygen is as small as about 2.1 eV. For example, the work function of $LaB_6$, which has been practically used as a thermoelectric field electron release material, is 2.7 eV, and the operating temperature thereof is about 1,500° C. When the electride C12A7 has an electric conductivity of more than $5\times10^2$ S/cm, the voltage drop in the material becomes less than 1 kV, and thus all the electric field applied to the material effectively contributes to the electron release. In addition, since heat generated from the material during the electron release is negligible, the temperature of the electron release material can be easily controlled.

Example 1

The present invention will now be described in more detail using Examples.

C12A7 single crystal prepared by a Czochralski method (Cz method) was processed into a rectangular parallelepiped having dimensions of 3 mm×3 mm×10 mm, and both surfaces of the sample were mirror-polished. The single crystal thin plate and about 5 g of titanium metal strip were placed in a quartz tube having an inner volume of about 10 cm³ and vacuum-sealed. Thus, five samples were prepared. The five samples were heat-treated under the heat-treatment conditions of sample heating temperatures and heating times shown in Table 1. The electron concentrations and the electric conductivities of the heat-treated samples are shown in Table 1.

TABLE 1

| Sample No. | Heat-treatment condition Temperature (° C.) | Time (h) | Electron concentration ×10²¹/cm³ | Electric conductivity ×10² S/cm |
|---|---|---|---|---|
| a | 900 | 24 | | <2 |
| b | 1,000 | 24 | | <2 |
| c | 1,000 | 72 | >1 | 8 |

TABLE 1-continued

| Sample No. | Heat-treatment condition Temperature (° C.) | Time (h) | Electron concentration ×10²¹/cm³ | Electric conductivity ×10² S/cm |
|---|---|---|---|---|
| d | 1,000 | 120 | >1 | 10 |
| e | 1,100 | 24 | >1 | 15 |

The surface of each of the single crystal samples after the heat treatment was black. X-ray diffraction spectra showed that $TiO_x$ was adhered to the surfaces of the samples. According to X-ray diffraction patterns, the single crystal after the removal of the $TiO_x$ layer from the surface of each of the samples maintained the crystal structure of C12A7. However, according to relative intensities of X-ray diffraction peaks, it was confirmed that free oxygen was extracted. Furthermore, absorption intensities at around 2.8 eV determined from light reflection spectra showed that the electron concentrations of samples c, d, and e were $10^{21}$/cm³ or more.

FIG. 1 shows the change in the electric conductivity in the temperature range of 4.2 K to 400 K of samples a, b, c, d, and e. Samples a and b had an electric conductivity of less than $2\times10^2$ S/cm at room temperature, and showed semiconducting electric resistance in which the electric conductivity increased with an increase in the temperature. In contrast, samples c, d, and e showed a metallic behavior in which the electric conductivity decreases with an increase in the temperature. The electric conductivities of samples c, d, and e at room temperature were $8\times10^2$ S/cm, $10\times10^2$ S/cm, and $15\times10^2$ S/cm, respectively. That is, these results show that electride C12A7 which has metallic electroconductivity and which has an electric conductivity of more than $5\times10^2$ S/cm at room temperature can be produced by a heat treatment in titanium metal vapor.

Example 2

FIG. 2 schematically shows a thermoelectric field electron release apparatus. Sample e was processed into a rectangular parallelepiped having dimensions of 0.6 mm×0.6 mm×2 mm. Furthermore, one of the ends of the sample was processed to prepare a truncated conical chip whose end has a flat surface with a diameter of 80 μm. The chip (1) was sandwiched between graphite electrodes (2), and the upper part of the chip (1) was covered with a rhenium metal film (3). Furthermore, the graphite electrodes (2) were sandwiched between conductive members (7) supporting the electrodes (2). The rhenium metal film (3) functions as a component for supplying current to the graphite electrodes (2) even if the graphite electrodes (2) are not electrically connected to the chip (1) and suppresses evaporation of the material from the side faces of the chip (1).

Current was supplied to the graphite electrodes (2), and the chip (1) was heated. An extracting electrode (4) was provided at a position 1 mm from the end of the chip (1). An extraction voltage in the range of 0 to 6 kV was applied between the chip (1) and the extracting electrode (4). An anode electrode (5) was provided at a position 30 mm below the extracting electrode (4), and an electron beam (6) released from the chip (1) was measured. This thermoelectric field electron release apparatus was installed in a vacuum chamber.

The degree of vacuum in the chamber was decreased to be in the range of 1.0 to $1.2\times10^{-5}$ Pa. The chip was directly energized while heating, and 6 kV of electric field was applied to the extracting electrode. The released electron beam was captured by the anode electrode, and the anode current was measured at each temperature. As shown in FIG. 3, electron releasing was started at a chip temperature of about 600° C., and the anode current was markedly increased at a chip temperature of about 900° C. The electron beam released in the thermoelectric field at a chip temperature of 900° C. and at an applied voltage of 6 kV was more than 50 μA, and this anode current was stably maintained for more than 100 hours. This result shows that the electride C12A7 having metallic electroconductivity can be used as a thermoelectric field electron release material.

BRIEF DESCRIPTION OF DRAWINGS

FIG. 1 is a graph showing the relationship between the electric conductivity of samples a, b, c, d, and e in Example 1 and the temperature.

FIG. 2 is a drawing that schematically shows a thermoelectric field release apparatus including an electron release chip fabricated from sample e of Example 1.

FIG. 3 is a graph showing the dependence of an electron beam released in a thermoelectric field on the temperature of an electron release chip in Example 2.

The invention claimed is:

1. An electride comprising:
   $12CaO \cdot 7Al_2O_3$ compound wherein free oxygen ions contained in cages present in crystals of a $12CaO \cdot 7Al_2O_3$ compound are extracted by heat-treating in titanium metal vapor and replaced with two electrons (each represented by $e^-$) per oxygen ion; and the electride substantially represented by $[Ca_{24}Al_{28}O_{64}]^{4+}(4e^-)$,
   wherein said $12CaO \cdot 7Al_2O_3$ compound has an electric conductivity of more than $5 \times 10^2$ S/cm and less than $10^5$ S/cm at room temperature, and has metallic electroconductivity in which the electric conductivity increases with a decrease in the temperature.

2. An electride according to claim 1, wherein the electride is used as an electron release material in an electron release element.

* * * * *